(12) United States Patent
Lin et al.

(10) Patent No.: US 10,490,272 B2
(45) Date of Patent: Nov. 26, 2019

(54) OPERATING METHOD OF RESISTIVE MEMORY ELEMENT

(71) Applicant: Winbond Electronics Corp., Taichung (TW)

(72) Inventors: Lih-Wei Lin, Taichung (TW);
Tsung-Huan Tsai, Taichung (TW);
Chi-Shun Lin, San Jose, CA (US);
Seow Fong Lim, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/118,445

(22) Filed: Aug. 31, 2018

(65) Prior Publication Data

US 2019/0088321 A1    Mar. 21, 2019

(30) Foreign Application Priority Data

Sep. 15, 2017 (CN) .......................... 2017 1 0831167

(51) Int. Cl.
*G11C 11/00* (2006.01)
*G11C 13/00* (2006.01)

(52) U.S. Cl.
CPC ........ *G11C 13/004* (2013.01); *G11C 13/0004* (2013.01); *G11C 13/0033* (2013.01); *G11C 13/0064* (2013.01); *G11C 13/0069* (2013.01); *G11C 13/0097* (2013.01)

(58) Field of Classification Search
CPC .............. G11C 13/004; G11C 13/0004; G11C 13/0033; G11C 13/0064; G11C 13/0069; G11C 13/0097

USPC ................................... 365/148, 46, 100, 163
See application file for complete search history.

(56) References Cited

U.S. PATENT DOCUMENTS

| | | | |
|---|---|---|---|
| 7,372,475 B2 * | 5/2008 | Vazac ...................... | B41J 2/325 347/171 |
| 7,826,248 B2 | 11/2010 | Xi et al. | |
| 8,869,436 B2 | 10/2014 | Tsai et al. | |
| 9,183,930 B2 * | 11/2015 | Perniola ............. | G11C 13/0007 |
| 2006/0203075 A1 * | 9/2006 | Vazac ...................... | B41J 2/325 347/171 |
| 2009/0213639 A1 | 8/2009 | Toda | |
| 2011/0013446 A1 | 1/2011 | Lung | |
| 2012/0069626 A1 | 3/2012 | Nakano et al. | |
| 2014/0254240 A1 * | 9/2014 | Perniola ............. | G11C 13/0007 365/148 |
| 2016/0350178 A1 | 12/2016 | Lien et al. | |
| 2016/0350183 A1 | 12/2016 | Lien et al. | |
| 2017/0060463 A1 | 3/2017 | Shim et al. | |
| 2017/0102994 A1 | 4/2017 | Lien et al. | |

FOREIGN PATENT DOCUMENTS

| | | |
|---|---|---|
| CN | 103999161 | 8/2014 |
| CN | 105719691 | 6/2016 |

\* cited by examiner

*Primary Examiner* — Harry W Byrne
(74) *Attorney, Agent, or Firm* — JCIPRNET

(57) ABSTRACT

An operating method of a resistive memory element includes: performing a thermal step on the resistive memory element; performing a set and reset cycle operation on the resistive memory element to increase a read margin of the resistive memory element after a thermal step; and determining whether the resistive memory element passes a read margin verification.

9 Claims, 7 Drawing Sheets

OPERATING METHOD OF RESISTIVE MEMORY ELEMENT

CROSS-REFERENCE TO RELATED APPLICATION

This application claims the priority benefit of China application serial no. 201710831167.6, filed on Sep. 15, 2017. The entirety of the above-mentioned patent application is hereby incorporated by reference herein and made a part of this specification.

TECHNICAL FIELD

The invention is related to an operating method of a memory element, and particularly to an operating method of a resistive memory element.

DESCRIPTION OF RELATED ART

In recent years, resistive memories (such as resistive random access memory (RRAM)) has been developed rapidly and currently considered as the most eye-catching structure of future memory. Since resistive memory has potential advantages of low power consumption, high speed operation, high density and being compatible with complementary metal oxide semiconductor (CMOS) manufacturing technology and thus is highly suitable for being used as a non-volatile memory device for the next generation.

Existing resistive memories normally include an upper electrode and a lower electrode configured to be opposite to each other and a dielectric layer disposed between the upper electrode and the lower electrode. Before the existing resistive memory is able to switch between high/low resistance states repeatedly to memorize data, it is required to perform a forming process in advance. The forming process includes applying a bias, such as positive bias, to a resistive memory such that a current flows from the upper electrode to the lower electrode and thus an oxygen vacancy and an oxygen ion are generated in a dielectric layer to form a current path, and then the resistive memory changes from a high resistance state (HRS) to a low resistance state (LRS) to form a conductive filament. Generally, in the formed filament, a portion of the diameter near the upper electrode is smaller than a portion of the diameter near the lower electrode. Thereafter, a reset or set operation may be performed on the resistive memory such that the resistive memory is switched to the high resistance state and the low resistance state respectively to complete the operation of memorizing data. In addition, when performing the reset operation on the existing resistive memory, a process of applying a reverse bias having a polarity opposite to the polarity of the bias for the set operation to the resistive memory is also performed such that the current flows from the lower electrode to the upper electrode. At this time point, the oxygen vacancy near the upper electrode is combined with a portion of the oxygen ion and thus the current path is interrupted, which causes the filament to open in the proximity of the upper electrode. When performing a setting operation on the existing resistive memory, a process of applying a bias having the same polarity in the forming process of filament to the resistive memory is also performed such that the current flows from the upper electrode to the lower electrode. At this time, the oxygen ion near the upper electrode is detached, and thus the oxygen vacancy is formed again such that the filament is formed again in the proximity of the upper electrode.

However, in existing technology, a read margin of the resistive memory is often reduced after a thermal step, which makes it impossible to correctly determine a logic state of the resistive memory. Therefore, it is currently an important issue to find out how to increase the read margin of resistive memory.

SUMMARY OF INVENTION

The invention provides an operating method of a resistive memory element, which is capable of increasing a read margin of the resistive memory element.

In the invention, the operating method of the resistive memory element includes performing a thermal step on the resistive memory element to reduce a read margin of the resistive memory element; performing a set and reset cycle operation on the resistive memory element so as to increase the reduced read margin of the resistive memory element; and determining whether the resistive memory element passes a read margin verification. The set and reset cycle operation is performed after the thermal step.

In the invention, the operating method of the resistive memory element includes performing a refresh operation on the resistive memory element; determining whether to perform a program and erase cycle operation on the resistive memory element depending on whether the resistive memory element is subjected to the thermal step so as to increase the read margin of the resistive memory element, wherein the read margin of the resistive memory element is reduced after the thermal step; and determining whether the resistive memory element passes the read margin verification. The program and erase cycle operation is performed after the refresh operation.

In summary, in the operating method of the invention, after the resistive memory element is subjected to the thermal step, the set and reset cycle operation or the program and erase cycle operation is performed so as to increase the read margin of the resistive memory element.

In order to make the aforementioned features and advantages of the invention more comprehensible, embodiments accompanying figures are described in detail below.

DESCRIPTION OF EMBODIMENTS

Figure 1:
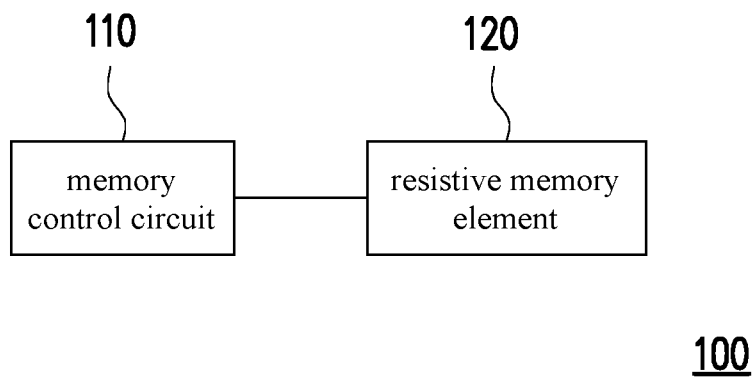
FIG. 1 is a schematic diagram of a memory storage device according to an embodiment of the invention.
Figure 2:
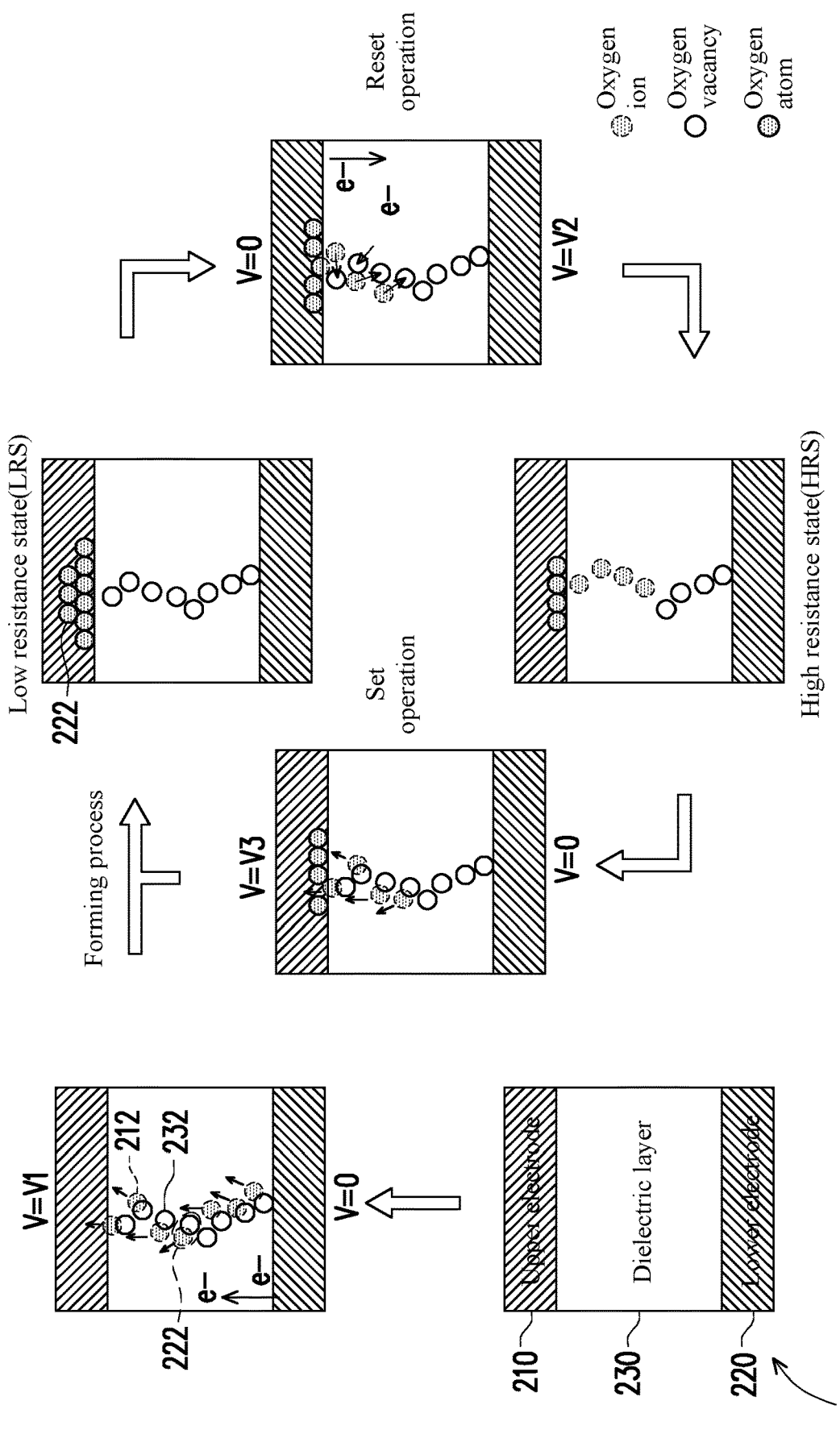
FIG. 2 is a schematic diagram of a filament in a memory cell that is subjected to a forming process, a reset operation and a set operation.

Referring to FIGS. 1 and 2, a memory storage device 100 of the embodiment includes a memory control circuit 110 and a resistive memory element 120 coupled to the memory control circuit 110. The resistive memory element 120 includes a plurality of memory cells 122 arranged in an array. In the embodiment, the memory cell 122 includes an upper electrode 210, a lower electrode 220 and a dielectric layer 230. The upper electrode 210 and the lower electrode 220 are metal conductors with a desirable conductivity, and the material of the two may be the same or different. The dielectric layer 230 is disposed between the upper electrode 210 and the lower electrode 220. The dielectric layer 230 includes a dielectric material such as a transition metal oxide. The memory cell 122 at least includes two resistance states. By applying different voltages to the upper electrode 210 and the lower electrode 220 respectively to change the resistance states of the memory cell 122, the memory cell 122 can serve the function of storing data.

In the embodiment, the memory cell 122 is, for example, a structure having one transistor and one resistor (1T1R), or a structure having two transistors and two resistors (2T2R), and sufficient teaching, suggestions and implementation regarding the embodiment of the memory cell may be derived from ordinary knowledge of the related field; the invention provides no limit to the structure of memory cell 122.

In the invention, the memory control circuit 110 is configured to perform a forming process on the memory cell 122. In the process, the electrode on both ends of the memory cell 122 is continuously applied with a bias V1 (i.e., forming voltage) so as to generate an external electric field with respect to the dielectric layer 230. In the embodiment, a positive voltage of V1 volt is applied to the upper electrode 210, and a voltage of 0 volt is applied to the lower electrode 220. The external electric field separates an oxygen atom 222 into an oxygen ion 212 and an oxygen vacancy 232. The oxygen vacancy 232 forms a filament in the dielectric layer 230 as a current path. When the external electric field exceeds a threshold value, a dielectric breakdown phenomenon is generated in the dielectric layer 230 and the memory cell is thus changed from the HRS into the LRS. The dielectric breakdown phenomenon is not permanent and the resistance value thereof can still be changed.

The memory cell 122 that is subjected to the forming process has a low resistance state. In the reset operation, the upper electrode 210 of the memory cell 122 is applied with a voltage of 0 volt, and the lower electrode 220 is applied with a positive voltage of V2 volt. Such voltage difference is a reset voltage of −V2 volt, for example. The state of the memory cell 122 that is subjected to the reset operation is changed from the LRS into the HRS. Subsequently, in the set operation, the upper electrode 210 of the memory cell 122 is applied with a positive voltage of V3 volt, and the lower electrode 220 is applied with a voltage of 0 volt. Such voltage difference is a set voltage of +V3 volt, for example. The state of the memory cell 122 that is subjected to the set operation is changed from the HRS into the LRS.

Figure 3:
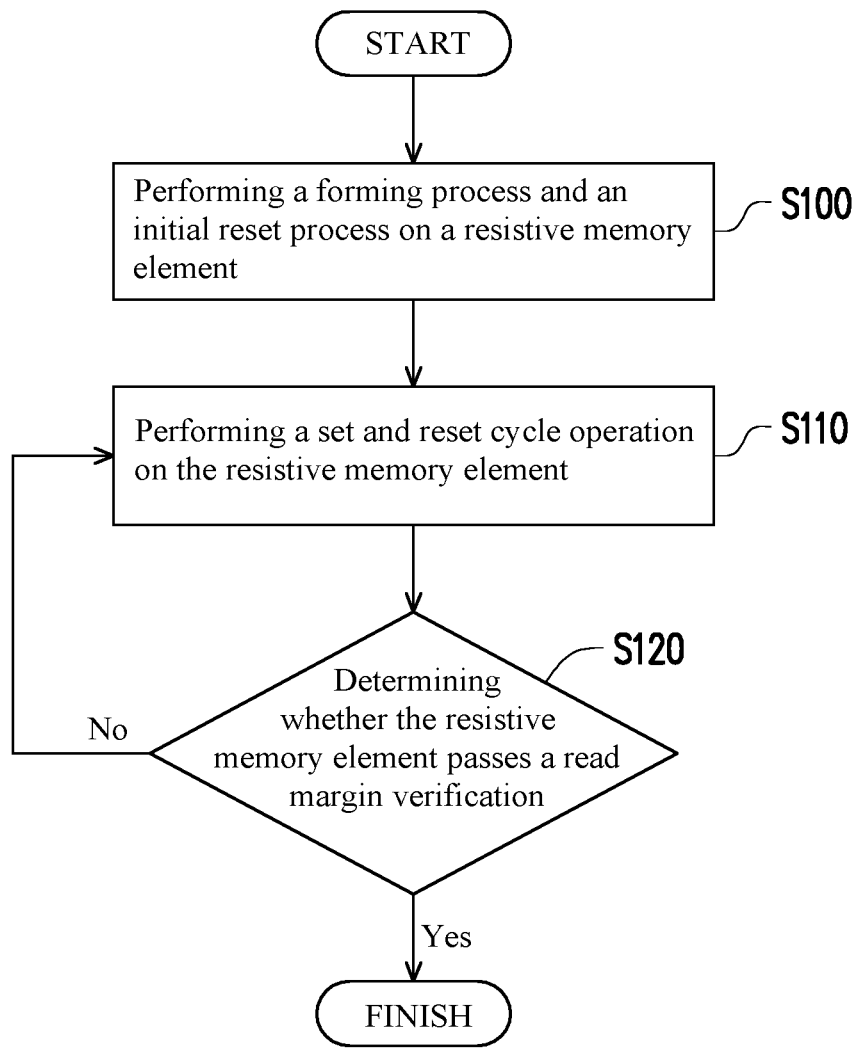
FIG. 3 illustrates an operating method of a resistive memory element according to an embodiment of the invention.

FIG. 3 illustrates an operating method of a resistive memory element according to an embodiment of the invention. Referring to FIG. 1 to FIG. 3, in step S100, the memory control circuit 110 in the embodiment performs the forming process and the initial reset process on the resistive memory element 120. Thereafter, in step S110, the memory control circuit 110 performs the set and reset cycle operation on the resistive memory element 120 so as to increase the read margin of the resistive memory element 120. In other words, as compared with the read margin of the resistive memory element 120 that is not subjected to step S110, the read margin of the resistive memory element 120 that is subjected to the step S110 is larger. In step S120, the memory control circuit 110 determines whether the resistive memory element 120 passes the read margin verification. The read margin verification includes setting a first current threshold value and a second current threshold value that is smaller than the first current threshold value, and comparing the current that flows through the resistive memory element 120 with the first current threshold value and the second current threshold value. When the current of the resistive memory element 120 is larger than the first current threshold value or smaller than the second current threshold value, it is determined that the resistive memory element 120 passes the read margin verification. When the current of the resistive memory element 120 is between the first current threshold value and the second current threshold value, it is determined that the resistive memory element 120 does not pass the read margin verification.

If the resistive memory element 120 does not pass the read margin verification, the memory control circuit 110 performs step S110 again to perform the set and reset cycle operation on the resistive memory element 120 repeatedly until the resistive memory element 120 passes the read margin verification. In an embodiment, the memory control circuit 110 may set a predetermined number of times so as to perform step S110 on the resistive memory element 120 repeatedly until the predetermined number of times is attained. On the other hand, if the resistive memory element 120 passes the read margin verification, the memory control circuit 110 finishes the set and reset cycle operation in step S110.

In the embodiment, the set and reset cycle operation includes at least one set operation and at least one reset operation, and sufficient teaching, suggestions and implementations regarding the embodiment of the set and reset cycle operation can be derived from ordinary knowledge of the related field.

Figure 4:
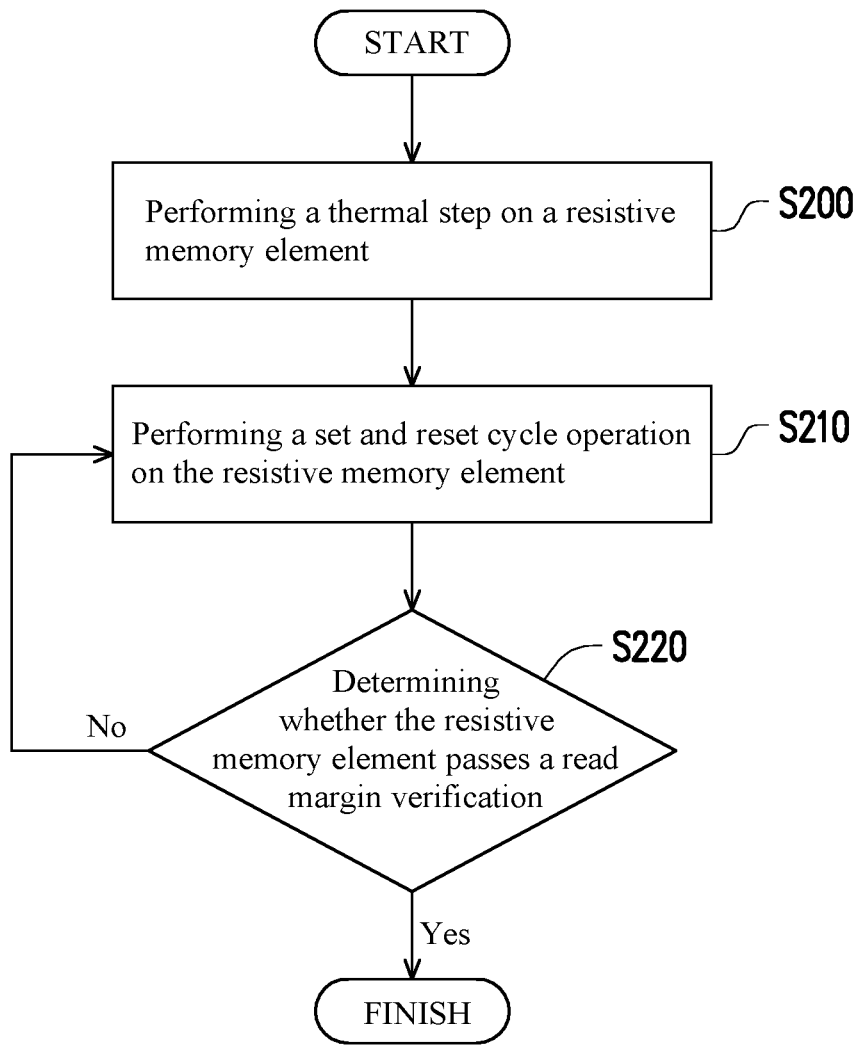
FIG. 4 illustrates an operating method of a resistive memory element according to another embodiment of the invention.

FIG. 4 illustrates an operating method of a resistive memory element according to another embodiment of the invention. Referring to FIG. 1, FIG. 2 and FIG. 4, in step S200, the memory control circuit 110 of the embodiment performs a thermal step on the resistive memory element 120. A read margin of the resistive memory element 120 is reduced after the thermal step. In step S210, the memory control circuit 110 performs the set and reset cycle operation on the resistive memory element 120 which has experienced the thermal step so as to increase the read margin of the resistive memory element 120. In other words, as compared with the read margin of the resistive memory element 120 that is not subjected to step S210, the read margin of the resistive memory element 120 that is subjected to step S210 is larger. In the embodiment, the set and reset cycle operation includes at least one reset operation and at least one set operation, and sufficient teaching, suggestions and implementation regarding the embodiment of the set and reset cycle operation may be derived from ordinary knowledge of the related field or the disclosure in FIG. 2. In the embodiment, step S210 is performed after step S200.

In step S220, the memory control circuit 110 determines whether the resistive memory element 120 passes the read margin verification. If the resistive memory element 120 does not pass the read margin verification, the memory control circuit 110 performs step S210 again so as to perform the set and reset cycle operation on the resistive memory element 120 repeatedly until the resistive memory element 120 passes the read margin verification. In an embodiment, the memory control circuit 110 may set a predetermined number of times so as to perform step S210 on the resistive memory element 120 repeatedly until the predetermined number of times is attained. On the other hand, if the resistive memory element 120 passes the read margin verification, the memory control circuit 110 finishes the set and reset cycle operation in step S210.

In an embodiment, the thermal step in step S200 may be generated when the memory control circuit 110 performs the forming process on the resistive memory element 120. Alternatively, in an embodiment, the thermal step in step S200 may be generated when the resistive memory element 120 is mounted on the circuit board. In the embodiment, the mounting step includes the thermal step, and the set and reset cycle operation is performed to program and erase the resistive memory element 120.

Figure 5:
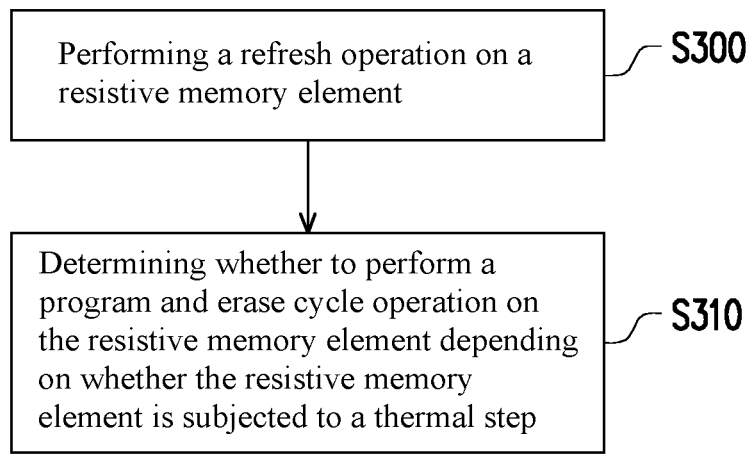
FIG. 5 illustrates an operating method of a resistive memory element according to another embodiment of the invention.

FIG. 5 illustrates an operating method of a resistive memory element according to another embodiment of the invention. Referring to FIG. 1, FIG. 2 and FIG. 5, in step S300, the memory control circuit 110 of the embodiment performs the refresh operation on the resistive memory element 120. In step S310, the memory control circuit 110 determines whether to perform the program and erase cycle operation on the resistive memory element 120 depending on whether the resistive memory element 120 is subjected to the thermal step so as to increase the read margin of the resistive memory element 120. In other words, as compared with the read margin of the resistive memory element 120 that is not subjected to the program and erase cycle operation, the read margin of the resistive memory element 120 that is subjected to the program and erase cycle operation is larger. In the embodiment, sufficient teaching, suggestions and implementation regarding the embodiment of the program and erase cycle operation and the refresh operation may be derived from ordinary knowledge of the related field.

In an embodiment, the resistive memory element 120 in FIG. 2 includes, for example, a temperature sensor for detecting temperature. When the memory control circuit 110 determines that a detected temperature is larger than a predetermined value, it is determined that the resistive memory element 120 is subjected to the thermal step.

In an embodiment, the resistive memory element 120 in FIG. 2 includes, for example, different cell arrays for detecting temperature and storing data respectively. For example, the resistive memory element 120 may include the first cell array for detecting temperature and the second cell array for storing data. In an embodiment, the number of cells in the first cell array is smaller than that of in the second cell array.

Figure 6:
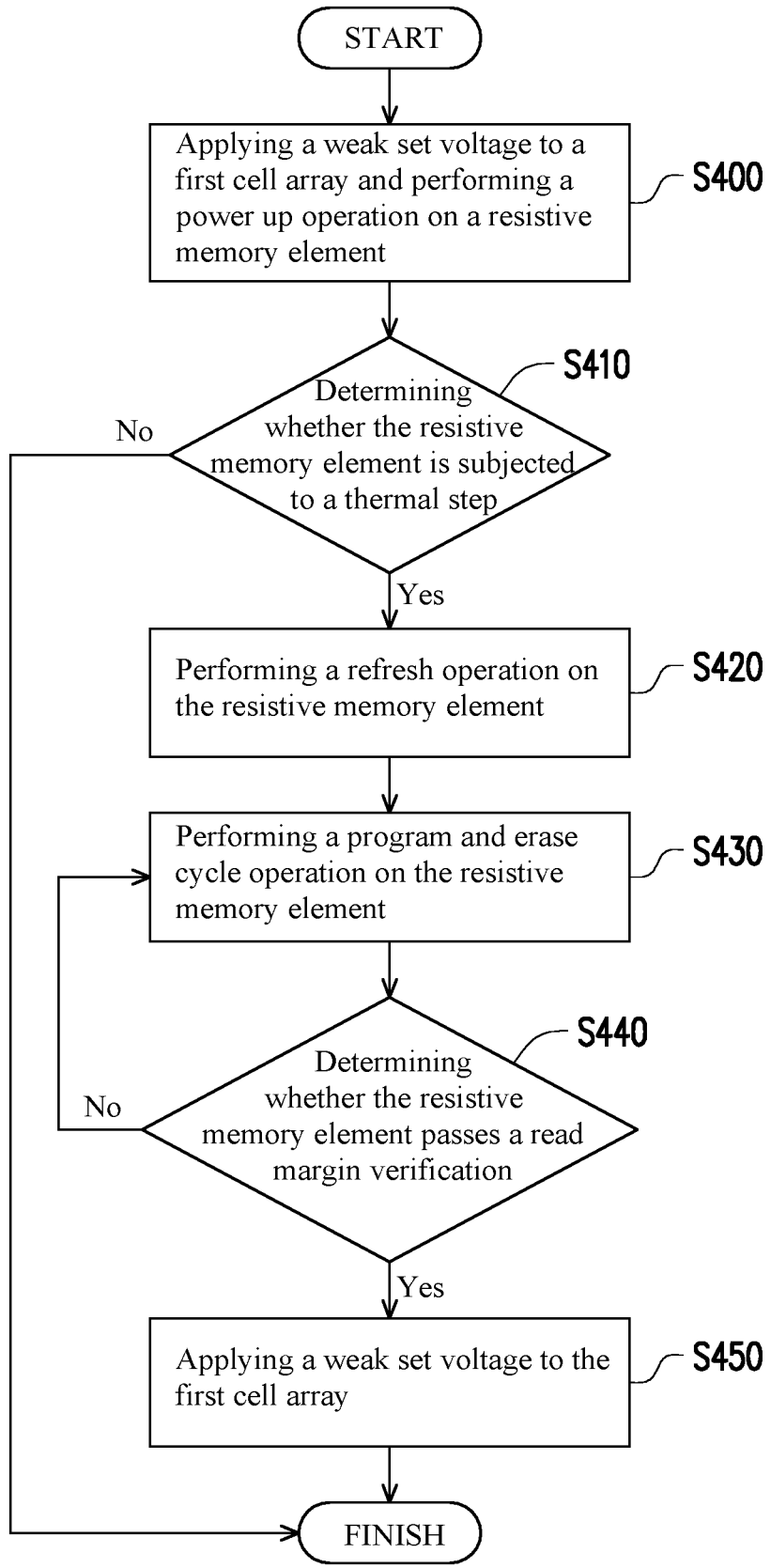
FIG. 6 illustrates an operating method of a resistive memory element according to another embodiment of the invention.

FIG. 6 illustrates an operating method of a resistive memory element according to another embodiment of the invention. In the embodiment, the resistive memory element 120 further includes the first cell array for detecting temperature and the second cell array for storing data. Referring to FIG. 1, FIG. 2 and FIG. 6, in step S400, the memory control circuit 110 in the embodiment applies a weak set voltage to the first cell array so that memory cells of the first cell array are changed from the first resistance state (e.g., HRS) into the second resistance state (e.g., LRS). Thereafter, a power up operation is performed on the resistive memory element 120. In the embodiment, the voltage value of the weak set voltage is smaller than the voltage value of the normal set voltage, for example, smaller than the voltage value V3 in FIG. 2. The data that is written according to the weak set voltage is easily flipped by high temperature, for example, to change from the second resistance state (e.g., LRS) into the first resistance state (e.g., HRS). Subsequently, in step S410, the memory control circuit 110 determines whether the resistive memory element 120 is subjected to the thermal step. If the resistive memory element 120 is not subjected to the thermal step, the memory control circuit 110 finishes the operating method of the resistive memory element 120.

If it is determined that the resistive memory element 120 is subjected to the thermal step, the memory control circuit 110 performs the refresh operation (step S420) on the resistive memory element 120. Next, in step S430, the memory control circuit 110 performs the program and erase cycle operation on the resistive memory element 120 so as to increase the read margin of the resistive memory element 120.

In step S440, the memory control circuit 110 of the embodiment determines whether the resistive memory element 120 passes the read margin verification. If the resistive memory element 120 does not pass the read margin verification, the memory control circuit 110 performs step S430 again to perform the program and erase cycle operation on the resistive memory element 120 repeatedly until the resistive memory element 120 passes the read margin verification. In an embodiment, the memory control circuit 110 may set a predetermined number of times so as to perform step S430 on the resistive memory element 120 repeatedly until the predetermined number of times is attained. On the other hand, if the resistive memory element 120 passes the read margin verification, the memory control circuit 110 performs step S450.

In step S450, the memory control circuit 110 of the embodiment applies the weak set voltage to the first cell array again such that the memory cells of the first cell array is changed from the first resistance state (e.g., HRS) into the second resistance state (e.g., LRS) so that the first cell array has the temperature detecting function again. Thereafter, the memory control circuit 110 finishes the operating method of the resistive memory element 120.

Figure 7:
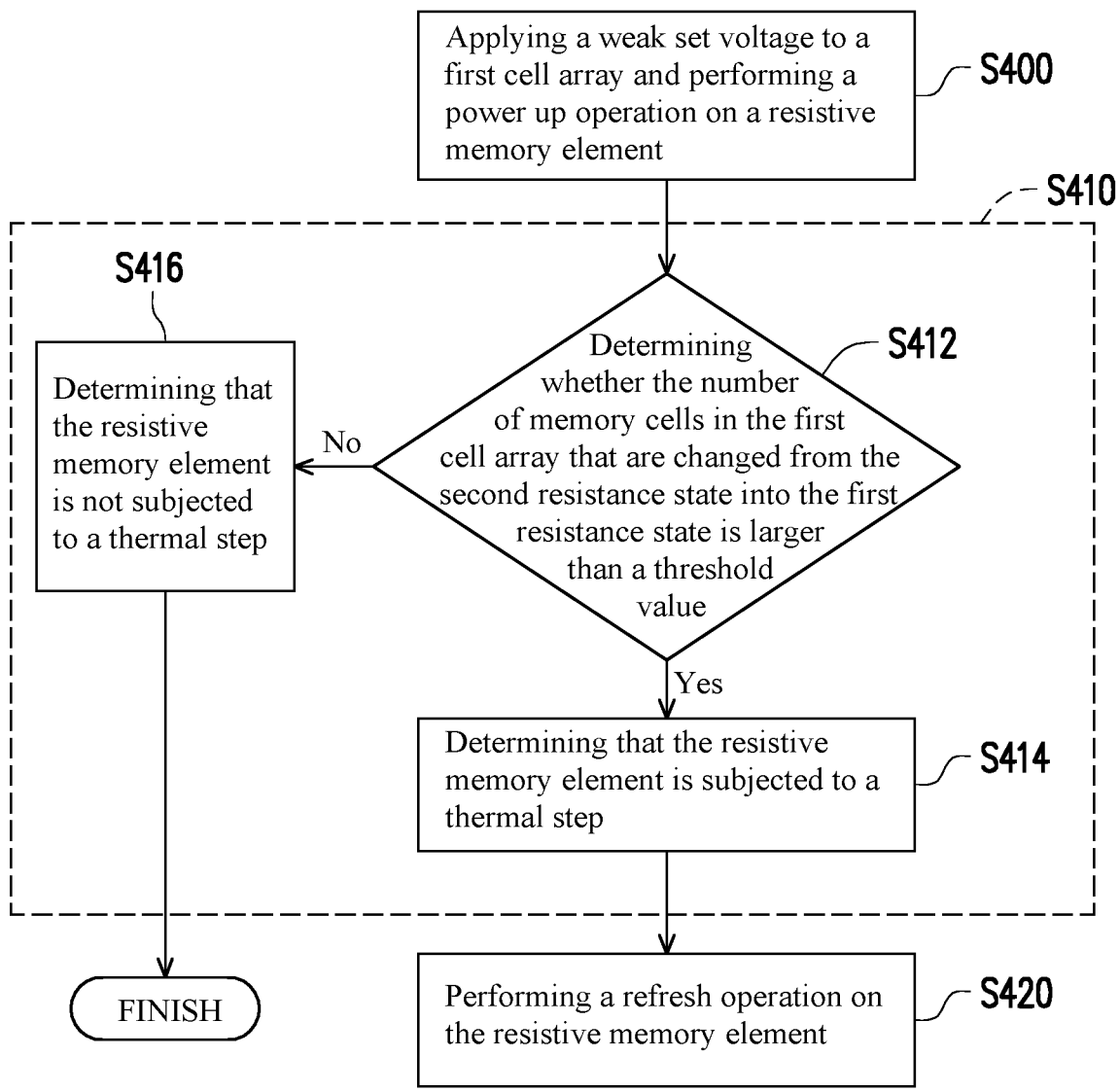
FIG. 7 is a flowchart diagram illustrating a step of determining whether a resistive memory element is subjected to a thermal step according to an embodiment of the invention.

FIG. 7 is a flowchart diagram illustrating a step of determining whether the resistive memory element is subjected to a thermal step according to an embodiment of the invention. Referring to FIG. 6 and FIG. 7, in the embodiment, the step S410 includes, for example, steps S412, S414 and S416. In step S412, the memory control circuit 110 determines whether the number of the memory cells in the first cell array that are changed from the second resistance state into the first resistance state is larger than a threshold value. If the number of the memory cells that are changed from the second resistance state into the first resistance state is larger than the threshold value, in step S414, the memory control circuit 110 determines that the resistive memory element 120 is subjected to the thermal step. If the number of the memory cells that are changed from the second resistance state into the first resistance state is smaller than or equal to the threshold value, in step S416, the memory control circuit 110 determines that the resistive memory element 120 is not subjected to the thermal step.

In summary, in the exemplary embodiments of the invention, after the resistive memory element is subjected to the thermal step, the operating method thereof includes the set and reset cycle operation or the program and erase cycle operation so as increase the read margin of the resistive memory element. In an exemplary embodiment, the resistive memory element has a temperature detecting function, and the memory control circuit may determine whether to perform the program and erase cycle operation on the resistive memory element accordingly so as to increase the read margin of the resistive memory element.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An operating method of a resistive memory element, comprising:
    performing a thermal step on the resistive memory element to reduce a read margin of the resistive memory element;
    performing a set and reset cycle operation on the resistive memory element so as to increase the reduced read margin of the resistive memory element; and
    determining whether the resistive memory element passes a read margin verification,
    wherein the set and reset cycle operation is performed after the thermal step.

2. The operating method of the resistive memory element according to claim 1, wherein after the set and reset cycle operation is performed on the resistive memory element, the operating method of the resistive memory element further comprises:
    if the resistive memory element passes the read margin verification, finishing the set and reset cycle operation; and
    if the resistive memory element does not pass the read margin verification, performing the set and reset cycle operation on the resistive memory element repeatedly until the resistive memory element passes the read margin verification or until a predetermined number of times is attained.

3. The operating method of the resistive memory element according to claim 1, further comprising:
    mounting the resistive memory element on a circuit board, wherein the mounting step comprises the thermal step,
    wherein the set and reset cycle operation is performed to program and erase the resistive memory element.

4. An operating method of a resistive memory element, comprising:
    performing a refresh operation on the resistive memory element;
    determining whether to perform a program and erase cycle operation on the resistive memory element according to whether the resistive memory element is subjected to a thermal step so as to increase a read margin of the resistive memory element, wherein the read margin of the resistive memory element is reduced after the thermal step; and
    determining whether the resistive memory element passes a read margin verification,
    wherein the program and erase cycle operation is performed after the refresh operation.

5. The operating method of the resistive memory element according to claim 4, further comprising:
    determining whether the resistive memory element is subjected to the thermal step;
    if the resistive memory element is subjected to the thermal step, performing the program and the erase cycle operation on the resistive memory element after the refresh operation is performed; and
    if the resistive memory element is not subjected to the thermal step, finishing the operating method of the resistive memory element.

6. The operating method of the resistive memory element according to claim 5, wherein the resistive memory element comprises a first cell array and a second cell array, the operating method of the resistive memory element further comprises:
    applying a weak set voltage to the first cell array so that a plurality of memory cells of the first cell array are changed from a first resistance state into a second resistance state, wherein a voltage value of the weak set voltage is smaller than a voltage value of a normal set voltage,
    wherein the step of determining whether the resistive memory element passes the thermal step comprises:
    determining whether a number of the memory cells in the first cell array that are changed from the second resistance state into the first resistance state is larger than a threshold value;
    if the number of the memory cells that are changed from the second resistance state into the first resistance state is larger than the threshold value, determining that the resistance memory element is subjected to the thermal step; and
    if the number of the memory cells that are changed from the second resistance state into the first resistance state is smaller than or equal to the threshold value, determining the resistive memory element is not subjected to the thermal step.

7. The operating method of the resistive memory element according to claim 5, wherein after the program and erase cycle operation is performed on the resistive memory element, the operating method of the resistive memory element further comprises:
    if the resistive memory element passes the read margin verification, finishing the program and erase cycle operation; and
    if the resistive memory element does not pass the read margin verification, performing the program and erase cycle operation on the resistive memory element repeatedly until the resistive memory element passes the read margin verification or until a predetermined number of times is attained.

8. The operating method of the resistive memory element according to claim 5, further comprising:
    performing a power up operation on the resistive memory element, wherein the step of determining whether the resistive memory element is subjected to the thermal step is performed after the power up operation is completed.

9. The operating method of the resistive memory element according to claim 8, wherein the refresh operation is performed after the power up operation is completed.

* * * * *